US010007006B2

(12) United States Patent
Nishihara

(10) Patent No.: US 10,007,006 B2
(45) Date of Patent: Jun. 26, 2018

(54) SEMICONDUCTOR PHOTODETECTION DEVICE, RADIATION COUNTING DEVICE, AND CONTROL METHOD OF SEMICONDUCTOR PHOTODETECTION DEVICE

(71) Applicant: SONY CORPORATION, Tokyo (JP)

(72) Inventor: Toshiyuki Nishihara, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days. days.

(21) Appl. No.: 15/502,741

(22) PCT Filed: Jul. 2, 2015

(86) PCT No.: PCT/JP2015/069097
§ 371 (c)(1),
(2) Date: Feb. 8, 2017

(87) PCT Pub. No.: WO2016/027572
PCT Pub. Date: Feb. 25, 2016

(65) Prior Publication Data
US 2017/0234994 A1  Aug. 17, 2017

(30) Foreign Application Priority Data
Aug. 18, 2014 (JP) ................................ 2014-165767

(51) Int. Cl.
*G01T 1/20* (2006.01)
*H01L 27/146* (2006.01)
(Continued)

(52) U.S. Cl.
CPC ...... *G01T 1/2018* (2013.01); *H01L 27/14663* (2013.01); *H04N 5/363* (2013.01); *H04N 5/374* (2013.01); *H04N 5/378* (2013.01)

(58) Field of Classification Search
CPC . G01T 1/2018; H01L 27/14663; H04N 5/363; H04N 5/374; H04N 5/378
See application file for complete search history.

(56) References Cited

U.S. PATENT DOCUMENTS

2007/0052564 A1* 3/2007 Funakoshi .......... H03M 1/0607
341/118
2008/0180546 A1* 7/2008 Thanh .................... H04N 5/361
348/229.1
(Continued)

FOREIGN PATENT DOCUMENTS

| JP | 2010-103913 A | 5/2010 |
| JP | 2011-097581 A | 5/2011 |
| WO | WO 2013/099723 A1 | 7/2013 |

OTHER PUBLICATIONS

International Search Report prepared by the Japan Patent Office dated Aug. 14, 2015, for International Application No. PCT/JP2015/069097.

*Primary Examiner* — David Porta
*Assistant Examiner* — Djura Malevic
(74) *Attorney, Agent, or Firm* — Sheridan Ross P.C.

(57) ABSTRACT

Noise of signals in an image sensor is reduced. A pixel circuit generates a reset signal of a predetermined initial voltage and an exposure signal of a signal voltage according to an exposure amount of light in order. An analog-digital conversion unit performs a reset sampling process of converting the reset signal into a first digital signal at a predetermined reset sampling interval and an exposure sampling process of converting the exposure signal into a second digital signal at an exposure sampling interval that does not exceed twice the predetermined reset sampling interval in order. A detection unit detects the light based on the first digital signal and a second digital signal.

14 Claims, 10 Drawing Sheets

(51) Int. Cl.
*H04N 5/363* (2011.01)
*H04N 5/374* (2011.01)
*H04N 5/378* (2011.01)

(56) References Cited

U.S. PATENT DOCUMENTS

| | | | |
|---|---|---|---|
| 2010/0060764 A1* | 3/2010 | McCarten | H01L 27/14641 348/308 |
| 2010/0103017 A1* | 4/2010 | Sakurai | H03M 1/1023 341/155 |
| 2010/0243866 A1* | 9/2010 | Mo | H03F 3/08 250/214 A |
| 2014/0375855 A1* | 12/2014 | Nishihara | H01L 27/14603 348/301 |

* cited by examiner

FIG. 5
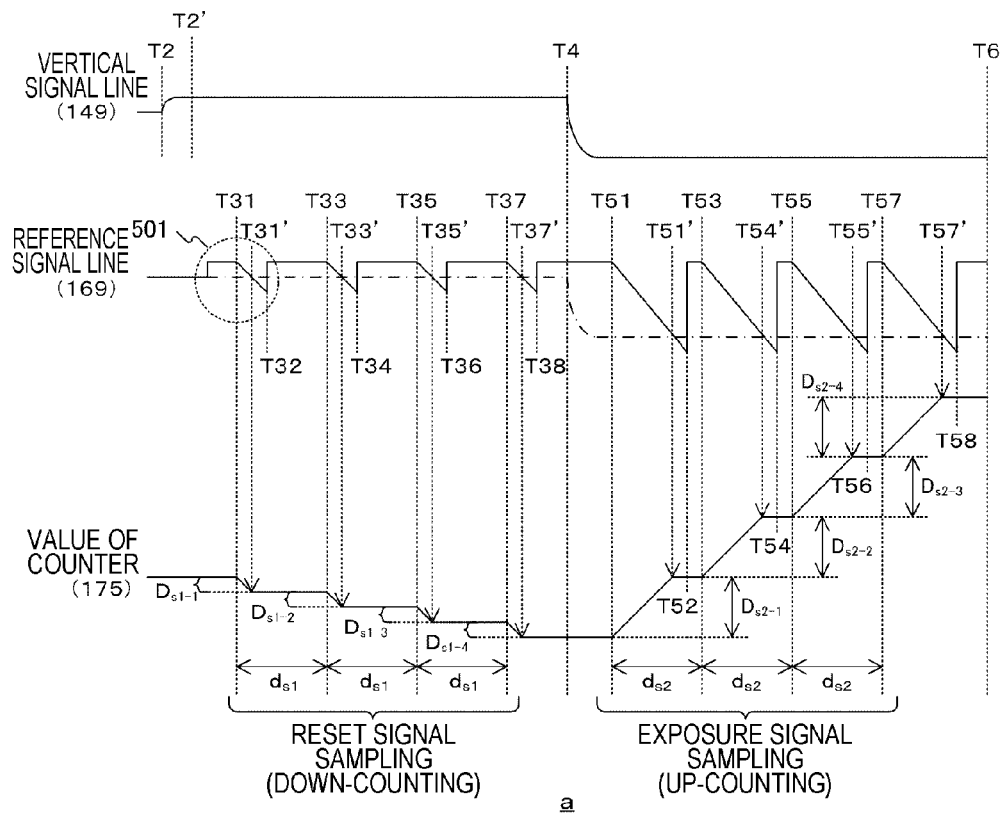
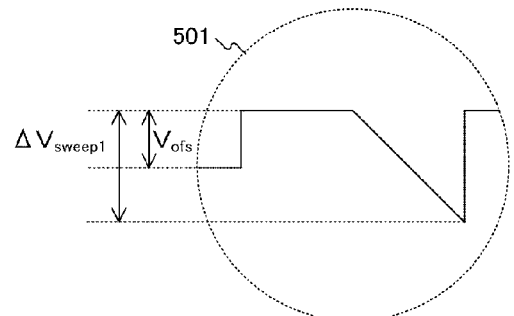

SEMICONDUCTOR PHOTODETECTION DEVICE, RADIATION COUNTING DEVICE, AND CONTROL METHOD OF SEMICONDUCTOR PHOTODETECTION DEVICE

CROSS REFERENCE TO RELATED APPLICATIONS

This application is a national stage application under 35 U.S.C. 371 and claims the benefit of PCT Application No. PCT/JP2015/069097 having an international filing date of 2 Jul. 2015, which designated the United States, which PCT application claimed the benefit of Japanese Patent Application No. 2014-165767 filed 18 Aug. 2014, the disclosures of which are incorporated herein by reference in their entirety.

TECHNICAL FIELD

The present technology relates to a semiconductor photodetection device, a radiation counting device, and a control method of the semiconductor photodetection device. The technology relates particularly to a semiconductor photodetection device which performs correlated double sampling, a radiation counting device, and a control method of the semiconductor photodetection device.

BACKGROUND ART

In recent years, complementary metal-oxide semiconductor (CMOS) imagers have been widely used in digital still cameras, camcorders, surveillance cameras, and the like, and also the market thereof has increasingly expanded. In such a CMOS imager, pixels convert incident light into electrons using photodiodes. Then, the pixels accumulate the electrons for a given period, and then output signals reflecting the amount of accumulated electric charge to an analog-to-digital (A/D) converter built into a chip via amplifier elements disposed in the pixels. The A/D converter digitizes the signal from the pixels, and then outputs the digitized signal to an image processing circuit of a signal processing circuit at the following stage. In the CMOS imager, such pixels are disposed in a matrix shape for imaging (refer to, for example, Patent Literature 1).

To read a signal from such a pixel, the CMOS imager performs the following operation. That is, before accumulated electric charge is transferred to an input node (a floating diffusion layer, etc.) of an amplifier element within the pixel, the CMOS imager resets the input to, for example, a voltage of a power supply to make it float. At this time, reset noise (kTC noise) occurs in the input node of the amplifier, and thus the CMOS imager reads a reset signal of this reset state from the pixel, and performs sampling on the result to set it as a reference signal. Subsequently, the CMOS imager transfers the accumulated electric charge, reads a signal thereof from the pixel as an exposure signal, and then performs sampling thereon. Then, the CMOS imager takes the difference between the sampled signals, and offsets the kTC noise. This signal processing is called correlated double sampling (CDS).

Here, the signal output from each pixel through sampling includes random noise of the amplifier element disposed in the pixel or random noise of a detection circuit itself. As a method of reducing such random noise, a method of performing sampling a plurality of times on the reset signal and the exposure signal in the correlated double sampling and adding or averaging the results is effective. In this manner, performing sampling on the reset signal or the exposure signal a plurality of times in correlated double sampling will be hereinafter referred to as multiple sampling.

CITATION LIST

Patent Literature

Patent Literature 1: JP 2011-97581A

DISCLOSURE OF INVENTION

Technical Problem

When the above-described CMOS imager is used in photon counting, or the like, it is required that pixels generate complete low noise and detection of ultra weak light be possible. A problem in this case is 1/f noise of pixel amplifiers. Here, 1/f noise is noise that has increasing noise power as a frequency becomes lower. Noise of a high frequency band beginning from thermal noise can be reduced through a band cut using a detection circuit or the above-described multiple sampling, but reducing noise components of a low frequency band is difficult. For this reason, it is difficult to reduce 1/f noise which has a lot of noise components also in low frequency bands.

The present technology takes the above circumstances into account, and thus aims to reduce noise of signals in an image sensor.

Solution to Problem

The present technology is achieved for solving the above-mentioned problem, and a first aspect of the present technology is to provide a semiconductor photodetection device including: a pixel circuit configured to generate a reset signal of a predetermined initial voltage and an exposure signal of a signal voltage according to an exposure amount of light in order; an analog-digital conversion unit configured to perform a reset sampling process of converting the reset signal into a first digital signal at a predetermined reset sampling interval and an exposure sampling process of converting the exposure signal into a second digital signal at an exposure sampling interval that does not exceed twice the predetermined reset sampling interval in order; and a detection unit configured to detect the light based on the first digital signal and a second digital signal, and a method of controlling the same. Accordingly, the effect that the exposure signal is converted into the digital signal at the exposure sampling interval that does not exceed twice the reset sampling interval is exhibited.

According to the first aspect, the exposure sampling interval may be a value that is 0.7 to 2.0 times the reset sampling interval. Accordingly, the effect that the exposure signal is converted into the digital signal at the exposure sampling interval that is 0.7 to 2.0 times the reset sampling interval is exhibited.

According to the first aspect, the exposure sampling interval may be a value that is 0.7 to 1.5 times the reset sampling interval. Accordingly, the effect that the exposure signal is converted into the digital signal at the exposure sampling interval that is 0.7 to 1.5 times the reset sampling interval is exhibited.

According to the first aspect, the exposure sampling interval may be a substantially identical value as the reset sampling interval. Accordingly, the effect that the exposure signal is converted into the digital signal at the exposure sampling interval that is the same as the reset sampling interval is exhibited.

According to the first aspect, the analog-digital conversion unit may include: a comparison unit configured to perform a process of comparing a voltage of a first sweep signal whose voltage changes at a constant rate after a timing of sampling of the reset signal elapses and a voltage of the reset signal, and a process of comparing a voltage of a second sweep signal whose voltage changes at a constant rate after a timing of sampling of the exposure signal elapses and a voltage of the reset signal in order; and a counter configured to count a count value according to a result obtained by the comparison performed by the comparison unit and supply a signal of the count value as the digital signal, and amounts of change of the respective first sweep signal and second sweep signal may be identical. Accordingly, the effect that the voltages of the respective first sweep signal and reset signal are compared and the voltages of the respective second sweep signal having the same sweep amount as the first sweep signal and exposure signal are compared is exhibited.

According to the first aspect, the analog-digital conversion unit may convert the reset signal into the first digital signal a number of times more than three times, and may convert the exposure signal into the second digital signal a number of times more than three times. Accordingly, the effect that the reset signal and the exposure signal are converted into the digital signals a number of times more than three times is exhibited.

According to the first aspect, the detection unit may detect the light based on the difference between the first digital signal and the second digital signal. Accordingly, the effect that light is detected based on the difference between the first digital signal and the second digital signal is exhibited.

According to the first aspect, the detection unit may detect the light based on whether a value according to the difference exceeds a predetermined threshold value. Accordingly, the effect that light is detected based on whether or not a value according to the difference exceeds the predetermined threshold value is exhibited.

According to the first aspect, the detection unit may calculate a statistic of the difference as a detection result of the light. Accordingly, the effect that a statistic of the difference is calculated as a detection result of light is exhibited.

A second aspect of the present technology is to provide a radiation counting device including: a scintillator configured to emit scintillation light when a radiation enters; a pixel circuit configured to generate a reset signal of a predetermined initial voltage and an exposure signal of a signal voltage according to an exposure amount of the scintillation light; an analog-digital conversion unit configured to perform a reset sampling process of converting the reset signal into a first digital signal at a predetermined reset sampling interval and an exposure sampling process of converting the exposure signal into a second digital signal at an exposure sampling interval that does not exceed twice the predetermined reset sampling interval in order; and a detection unit configured to detect the light based on the first digital signal and the second digital signal. Accordingly, the effect that the exposure signal is converted into the digital signal at the exposure sampling interval that does not exceed twice the reset sampling interval is exhibited.

Advantageous Effects of Invention

According to the present technology, an excellent effect that noise of signals can be reduced in an image sensor can be exhibited. Note that effects described herein are not necessarily limitative, and include any effect described in the present disclosure.

BRIEF DESCRIPTION OF DRAWINGS

FIG. 5 is a timing chart showing an example of an operation of the image sensor according to the first embodiment.

MODE(S) FOR CARRYING OUT THE INVENTION

Hereinafter, embodiments for implementing the present technology (hereinafter referred to as embodiments) will be described. Description will be provided in the following order.

1. First embodiment (Example in which exposure sampling interval is set to be no more than twice reset sampling interval)

2. Second embodiment (Example in which radiation counting is performed by setting exposure sampling interval to be no more than twice reset sampling interval)

<1. First Embodiment>
[Example of Configuration of Image Sensor]

Figure 1:
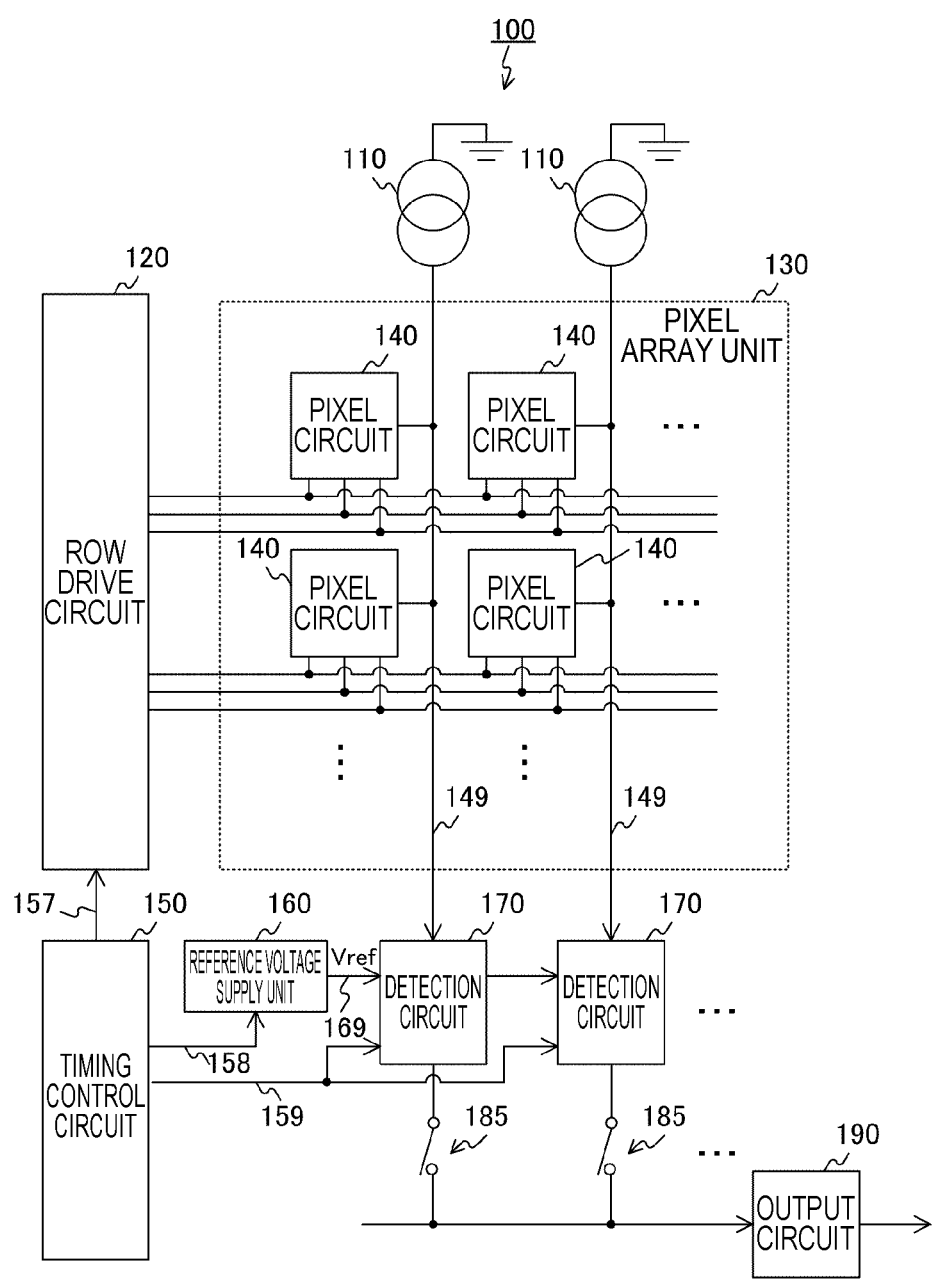
FIG. 1 is a block diagram showing an example of a configuration of an image sensor according to a first embodiment.

FIG. 1 is a block diagram showing an example of a configuration of an image sensor 100 according to a first embodiment. This image sensor 100 includes a plurality of constant current circuits 110, a row drive circuit 120, a pixel array unit 130, a timing control circuit 150, a reference voltage supply unit 160, a plurality of detection circuits 170, a plurality of switches 185, and an output circuit 190. Note that the image sensor 100 is an example of the semiconductor photodetection device described in the claims.

The pixel array unit 130 has a plurality of pixel circuits 140 arrayed in a two-dimensional matrix shape. A plurality of pixel circuits 140 arrayed in a predetermined direction will be hereinafter referred to as a "row," and a plurality of pixel circuits 140 arrayed in a direction vertical to a row will be hereinafter referred to as a "column." Each of the aforementioned constant current circuits 110, detection circuits 170, and switches 185 is provided in each column.

Each pixel circuit 140 converts light into an analog electric signal according to control of the row drive circuit 120. The pixel circuit 140 supplies the electric signal to the corresponding detection circuit 170 via a vertical signal line 149. This electric signal includes the above-mentioned reset signal or exposure signal.

The row drive circuit 120 controls each of the pixel circuits 140 via a plurality of control lines according to control of the timing control circuit 150. This row drive circuit 120 selects rows in order, exposes selected rows to light, and causes electric signals (reset signals or accumulation signals) to be output from the pixel circuits 140 of rows that have undergone light exposure. These electric signals are read by the detection circuits 170. In this manner, the control of exposing the rows to light in order is called a rolling shutter method. The control performed at the time of the exposure and reading will be described below in more detail.

Each constant current circuit 110 generates a constant current, and supplies it to a corresponding vertical signal line 149.

The timing control circuit 150 controls operation timings of the row drive circuit 120, the reference voltage supply unit 160, and the detection circuits 170. This timing control circuit 150, for example, generates a timing control signal indicating a row scanning timing, and supplies the signal to the row drive circuit 120. In addition, the timing control circuit 150 generates a digital-to-analog (DAC) control signal to control an operation of supplying a reference voltage, and supplies the signal to the reference voltage supply unit 160. Further, the timing control circuit 150 supplies a detection control signal to control an operation of each detection circuit 170 to the detection circuit 170. The DAC control signal and the detection control signal will be described below in more detail.

The reference voltage supply unit 160 generates the reference voltage $V_{ref}$ according to the DAC control signal, and supplies it to each of the detection circuits 170.

Each detection circuit 170 performs photodetection based on an electric signal according to the detection control signal. The detection circuit 170 performs a correlated double sampling (CDS) process on these signals to detect light. The detection circuit 170 supplies a digital signal indicating the detection result to each switch 185.

Each switch 185 opens or closes a path between its corresponding detection circuit 170 and the output circuit 190. The switches 185 in the respective columns sequentially supply digital signals to the output circuit 190 according to control of a column drive circuit (not illustrated) which sequentially selects the columns.

The output circuit 190 outputs the digital signals to an image processing device or the like.

[Example of Configuration of Pixel Circuit]

Figure 2:
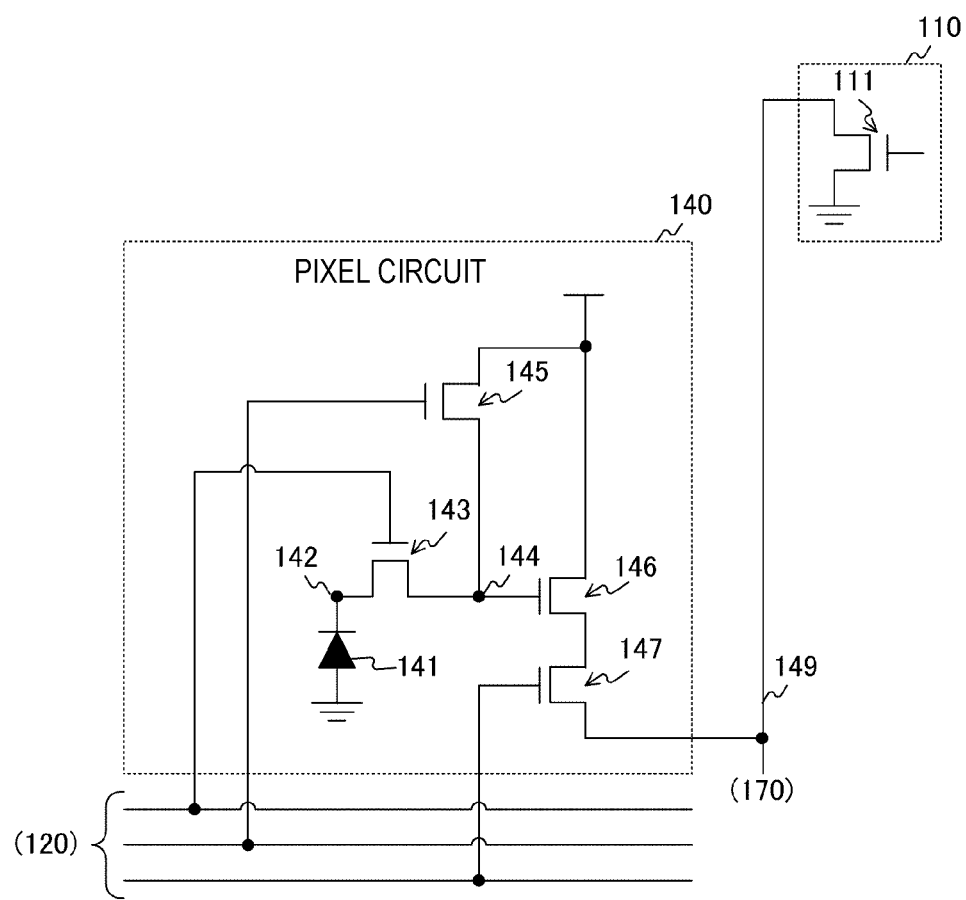
FIG. 2 is a circuit diagram showing an example of a configuration of a pixel circuit according to the first embodiment.

FIG. 2 is a circuit diagram showing an example of a configuration of a pixel circuit 140 according to the first embodiment. This pixel circuit 140 includes a photodiode 141, an accumulation node 142, a transfer transistor 143, a detection node 144, a reset transistor 145, an amplifier transistor 146, and a selection transistor 147. An n-type metal-oxide semiconductor field-effect transistor (MOS-FET), for example, is used as the transfer transistor 143. n-type MOSFETs or the like similar thereto may be used for the reset transistor 145, the amplifier transistor 146, and the selection transistor 147.

The photodiode 141 converts light into electric charge. This photodiode 141 is connected to the transfer transistor 143 via the accumulation node 142. The photodiode 141 generates pairs of electrons and holes from photons incident on a silicon substrate of the pixel circuit 140, and accumulates electrons among them in the accumulation node 142.

The transfer transistor 143 transfers the electric charge from the accumulation node 142 to the detection node 144 according to control of the row drive circuit 120.

The detection node 144 accumulates the electric charge from the transfer transistor 143 and generates a voltage according to the amount of the accumulated electric charge. A floating diffusion layer, for example, is used as the detection node 144. This voltage is applied to the gate of the amplifier transistor 146.

The reset transistor 145 draws the electric charge accumulated in the accumulation node 142 and the detection node 144 out to a power supply for initialization. The gate of this reset transistor 145 is connected to the row drive circuit 120, the drain thereof is connected to the power supply, and the source thereof is connected to the detection node 144.

The row drive circuit 120, for example, controls the reset transistor 145 to be simultaneously in an on-state with the transfer transistor 143 to draw the electrons accumulated in the accumulation node 142 out to the power supply, and initializes the pixel to be in a dark state before the accumulation, i.e., in a no-light incidence state. In addition, the row drive circuit 120 controls only the transfer transistor 143 to be in an on-state to draw the electric charge accumulated in the detection node 144 out to the power supply and initializes the amount of the electric charge.

The amplifier transistor 146 amplifies a voltage of a gate. The gate of the amplifier transistor 146 is connected to the detection node 144, the drain thereof is connected to the power supply, and the source thereof is connected to the selection transistor 147. The amplifier transistor 146 and the constant current circuit 110 form a source follower, and a voltage of the detection node 144 is output to the vertical signal line 149 with a gain of slightly less than 1. The electric signal of the voltage is acquired by the detection circuit 170.

The selection transistor 147 outputs an electric signal according to control of the row drive circuit 120. The gate of the selection transistor 147 is connected to the row drive circuit 120, the drain thereof is connected to the amplifier transistor 146, and the source thereof is connected to the vertical signal line 149. The row drive circuit 120 selects one row, turns all selection transistors 147 in the selected row on, and thereby causes the electric signal to be output to pixel circuits 140 in the row.

In addition, the constant current circuit 110 has, for example, an MOS transistor 111. The gate of the MOS transistor receives application of a predetermined voltage, the drain thereof is connected to the vertical signal line 149, and the source thereof is grounded. This constant current circuit 110 is connected to each of pixel circuits 140 in a column via the vertical signal line 149.

Such a CMOS imager has had decreased parasitic capacitance inside pixel circuits due to miniaturization thereof in the recent years, and specifically, the parasitic capacitance of the detection node 144 of FIG. 2 is significantly decreased, which improves conversion efficiency, and as a result, improves sensitivity. On the other hand, the quality of a crystal of a substrate has improved, and thus reduction in noise has progressed. That is, a signal-to-noise (S/N) ratio of a signal has significantly improved, and due to this trend, there is a possibility of this being used as a photodetector that supports ultra-low illuminance. The image sensor 100 is used as a photon counting device with the entire pixel array unit 130 in a chip set as one light receiving surface. Such devices are expected to replace photomultiplier tubes, and the like.

Note that the image sensor 100 may be mounted in an imaging device which detects natural light to be used in imaging of image data, such as a digital still camera or surveillance camera, rather than being used in photon counting.

Figure 3:
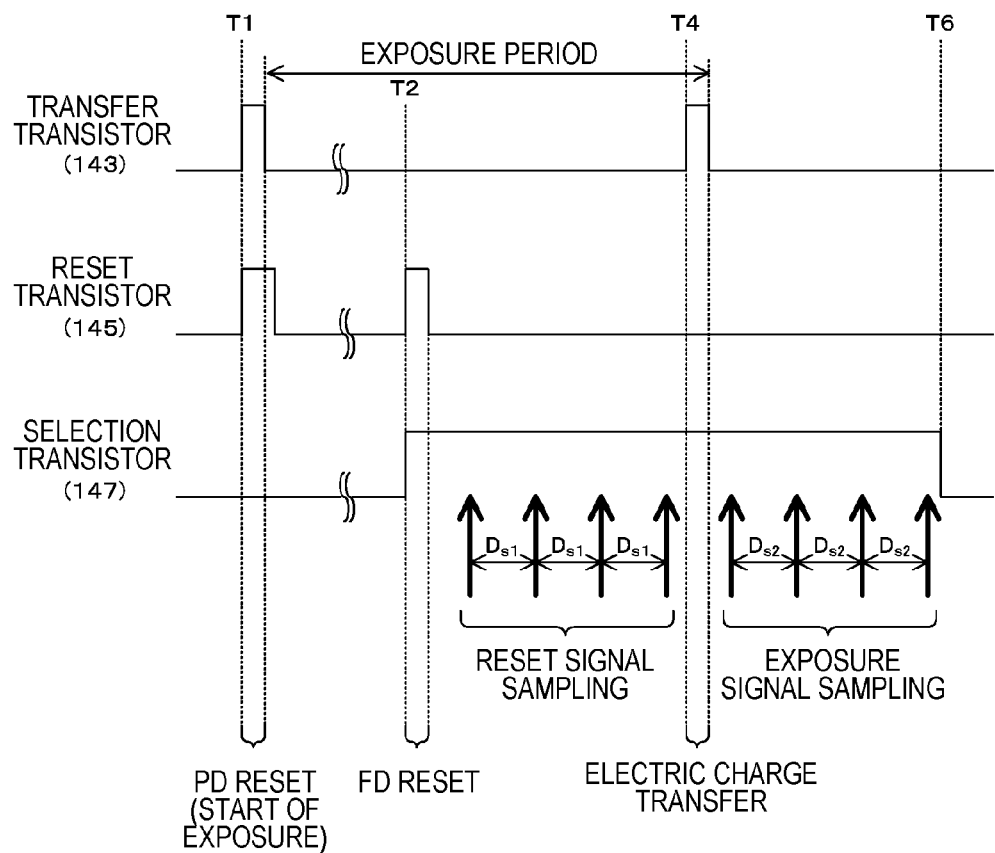
FIG. 3 is a timing chart showing an example of an operation of the pixel circuit according to the first embodiment.

FIG. 3 is a timing chart showing an example of an operation of the pixel circuit 140 according to the first embodiment.

The row drive circuit 120 controls both the transfer transistor 143 and the reset transistor 145 to be in an on-state at a timing T1 immediately before an exposure period. Through this control, all electric charge accumulated in the accumulation node 142 between the photodiode 141 and the transfer transistor 143 is discharged to the power supply. This control will be hereinafter referred to as a "photodiode (PD) reset." Thereafter, the row drive circuit 120 controls the transfer transistor 143 to be in an off-state. Through this control, the accumulation node 142 is brought into a floating state, and accumulation of new electric charge is started. In addition, the row drive circuit 120 controls the reset transistor 145 to be in an off-state after the PD reset. Note that the reset transistor 145 may remain in the on-state during accumulation of electric charge. On the other hand, the selection transistor 147 is controlled to be in an off-state in order to enable access to another pixel circuit 140 connected to the vertical signal line 149.

Then, the row drive circuit 120 controls the reset transistor 145 and the selection transistor 147 to be in an on-state at a timing T2 before an end of the exposure period. Through the control over the selection transistor 147, the selected pixel circuit 140 is connected to the vertical signal line 149. In addition, through the control over the reset transistor 145, the detection node 144 that is the input of the amplifier transistor 146 and the power supply are short-circuited. Accordingly, a reference potential is generated in the selected pixel circuit 140.

When a pulse period elapses from the timing T2, the row drive circuit 120 controls the reset transistor 145 to be in an off-state. Through this control, a potential of the detection node 144 is coupled with the gate of the reset transistor 145 and thus is lowered from the reference potential a little bit, which results in a floating state. Furthermore, the detection node 144 at that time generates significant kTC noise. This control will be hereinafter referred to as "FD reset" because a floating diffusion layer is generally used as the detection node 144.

The detection circuit 170 performs sampling a plurality of times (for example, 4 times) at a given interval $d_{s1}$ for the period from the FD reset to an end of the exposure period. In the sampling, the detection circuit 170 converts a signal of a potential of the vertical signal line 149 into a digital signal $D_{s1}$ as a reset signal. The interval $d_{s1}$ will be hereinafter referred to as a "reset sampling interval." Multiple sampling of this reset signal is treated as first reading in correlated double sampling.

Then, the row drive circuit 120 controls the transfer transistor 143 to be in an on-state at a timing T4 at which the exposure period ends. Through this control, the electric charge accumulated in the accumulation node 142 is transferred to the detection node 144. At this time, if a potential of the detection node 144 is sufficiently deep, electrons accumulated in the accumulation node 142 are all transferred to the detection node 144, and thus the accumulation node 142 is brought into a complete depletion state. When a pulse period elapses from the timing T4, the row drive circuit 120 controls the transfer transistor 143 to be in an off-state. Through this control, the potential of the detection node 144 is lowered (i.e., the potential becomes shallow) by the amount of the accumulated electric charge, in comparison to before driving of the transfer transistor 143. This lowered voltage is amplified by the amplifier transistor 146 and output to the vertical signal line 149.

The detection circuit 170 performs sampling a plurality of times (for example, 4 times) at a given interval $d_{s2}$ for the period from the control of the transfer transistor 143 to be in the off-state to a timing T6. In this sampling, the detection circuit 170 converts a signal of a potential of the vertical signal line 149 into a digital signal $D_{s2}$ as an exposure signal. The interval $d_{s1}$ will be hereinafter referred to as an "exposure sampling interval." Multiple sampling of this exposure signal is treated as second reading in the correlated double sampling.

The detection circuit 170 compares the sampled exposure signal (i.e., the digital signal $D_{s2}$) and reset signal (i.e., the digital signal $D_{s1}$), and determines an amount of incident photons based on the comparison result. A plurality of digital signals $D_{s1}$ are added together, and the average value thereof is calculated if necessary. Likewise, digital signals $D_{s2}$ are added together and averaged if necessary. The detection circuit 170 obtains the difference between the sum value (or the average value) of the digital signals $D_{s1}$ and the sum value (or the average value) of the digital signals $D_{s2}$ as a net exposure signal. The kTC noise generated in the FD reset is offset by taking the difference between the digital signals $D_{s1}$ and $D_{s2}$.

Here, noise cancellation through CDS is effective not only for fixed noise such as kTC noise but also low frequency noise. A frequency of noise at which an offset effect is obtained is dependent on a CDS interval $d_c$, and a corresponding frequency band is a band of about $1/d_c$ or lower. The CDS interval is an interval between a sampling timing of the reset signal and a sampling timing of the exposure signal. On the other hand, a band of noise reduced through multiple sampling is dependent on a sampling interval $d_s$, and a cut-off frequency band is a band of about $10/d_s$ or higher. $d_{s1}$ is set as the sampling interval $d_s$ at the time of reset sampling, and $d_{s2}$ is set as the sampling interval $d_s$ at the time of exposure sampling.

Due to the above-described properties, if the CDS interval $d_c$ is set to be short, its cut-off band expands to a high frequency side, and if the sampling interval $d_s$ is set to be long, its cut-off band expands to a low frequency side. On the other hand, the CDS interval $d_c$ is regulated by the sampling interval $d_s$ in terms of the reading operation procedure. Thus, if a relation between $d_c$ and $d_s$ is suitably adjusted by optimizing the reading operation procedure, a noise cut is implemented substantially through the entire band, which also contributes to a reduction of 1/f noise. It has been elicited from an estimation using a transfer function, etc., that setting the sampling interval $ds_2$ of the exposure signal to be no more than twice the sampling interval $ds_1$ of the reset signal in a CDS operation is effective for reducing 1/f noise. The course of this elicitation will be described below in detail.

Note that it is desirable to set the interval between the final sampling timing of the reset signal and the first sampling timing of the exposure signal to be as short as possible.

An exposure period of each pixel circuit 140 is a period between a PD reset and a reading operation, and more precisely, a period after the transfer transistor transitions to an off-state after the PD reset to the timing T4 at which the transfer transistor is controlled to be on in reading. If photons are incident on the photodiode 141 and electric charge is generated in the period, the electric charge is the difference between the digital signals $D_{s1}$ and $D_{s2}$, and is calculated by the detection circuit 170 according to the above-described procedure.

[Example of Configuration of Detection Circuit]

Figure 4:
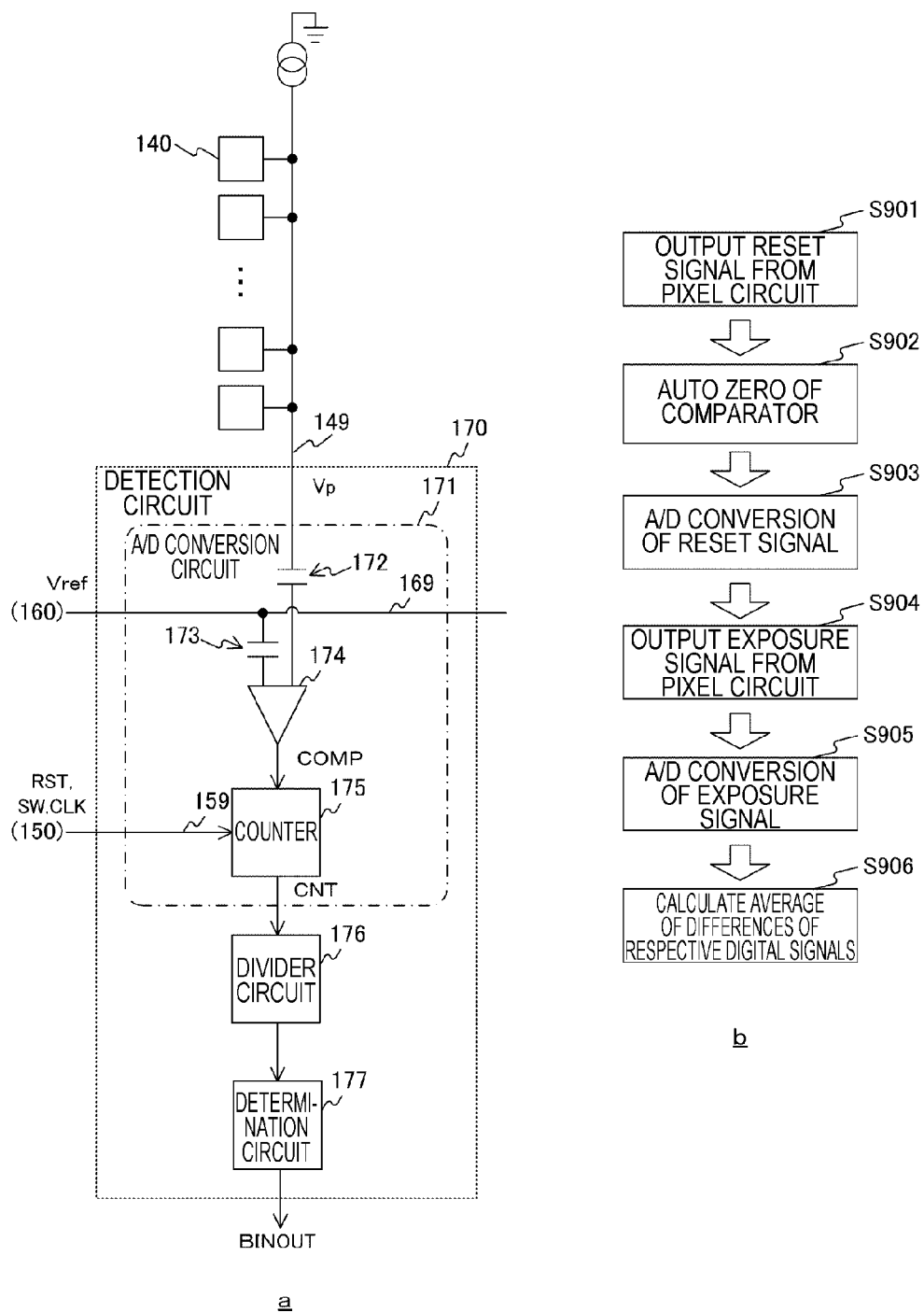
FIG. 4 is a diagram showing examples of a functional configuration of a detection circuit and an operation of the detection circuit according to the first embodiment.

FIG. 4 is a diagram showing examples of a functional configuration of the detection circuit 170 and an operation of the detection circuit 170 according to the first embodiment. a of the drawing is a circuit diagram showing the example of the functional configuration of the detection circuit 170 according to the first embodiment. The detection circuit 170 includes an A/D conversion circuit 171, a divider circuit 176, and a determination circuit 177.

The A/D conversion circuit 171 converts a reset signal and an exposure signal into digital signals in order (i.e., performs sampling) according to control of the timing control circuit 150. This A/D conversion circuit 171 includes capacitors 172 and 173, a comparator 174, and a counter 175. Note that the A/D conversion circuit 171 is an example of the analog-digital conversion unit described in the claims.

The capacitor 172 is connected to a vertical signal line 149 and one of two input terminals of the comparator 174, and the capacitor 173 is connected to the other one of the two input terminals of the comparator 174 and a reference signal line 169. In addition, capacitances of these capacitors 172 and 173 are substantially the same, and these capacitors are also called coupling capacitors.

The comparator 174 compares an output voltage $V_p$ of the vertical signal line 149 and a reference voltage $V_{ref}$ of the reference signal line 169. In multiple sampling of the reset signal, a reset level of the reset signal is output as the output voltage $V_p$, and in multiple sampling of the exposure signal, a signal level of the exposure signal is output as the output voltage $V_p$. The comparator 174 supplies the comparison result COMP to the counter 175. For example, if the output voltage $V_p$ is higher than the reference voltage $V_{ref}$, a high-level comparison result COMP is output, and if not, a low-level comparison result COMP is output. In addition, the comparator 174 has an auto zero function of short-circuiting the two input terminals in its inside.

The counter 175 counts a count value based on the comparison result COMP of the comparator 174. This counter 175 can switch between execution of, for example, up-counting to increment a count value and down-counting to decrement a count value.

The detection circuit 170 performs sampling a plurality of times (for example, 4 times) at a given interval $d_{s2}$ for the period from the control of the transfer transistor 143 to be in the off-state to a timing T6. In this sampling, the detection circuit 170 converts a signal of a potential of the vertical signal line 149 into a digital signal $D_{s2}$ as an exposure signal. The interval $d_{s2}$ will be hereinafter referred to as an "exposure sampling interval." Multiple sampling of this exposure signal is treated as second reading in the correlated double sampling.

When the initialization instruction signal RST is supplied, the counter 175 sets a count value to an initial value. In addition, the counter 175 performs either up-counting or down-counting according to the switch instruction signal SW. Furthermore, when the output voltage $V_p$ is higher than the reference voltage $V_{ref}$ (in other words, the comparison result COMP is a high level), the counter 175 performs up-counting or down-counting in synchronization with the clock signal CLK. The counter 175 supplies a count value CNT to the divider circuit 176.

The divider circuit 176 divides the count value CNT into the number of times of sampling (for example, 4 times). For example, division is performed through a bit shift operation, etc. The divider circuit 176 supplies the division result to the determination circuit 177 as a pixel signal.

The determination circuit 177 compares the value of the pixel signal and a predetermined threshold value, and determines presence of incidence of photons based on the comparison result. When the value of the pixel signal is higher than the threshold value, for example, photons are determined to have been incident, and when it is not, photons are determined not to have been incident. If such photon detection is performed one time at a sufficiently low error rate, an influence of random noise is substantially completely removed, and thus when ultra weak light is detected like when a far smaller number of photons than the number of pixel circuits 140 arrayed in the pixel array unit 130 are incident, a light amount of the number of incident photons can be determined with a high accuracy. The determination circuit 177 generates a digital signal BINOUT of one bit indicating the determination result and outputs the signal to the output circuit 190 via the switch 185. Note that the divider circuit 176 and the determination circuit 177 are an example of the detection unit described in the claims.

Note that, although the detection circuit 170 performs photon counting, the circuit may not perform photon counting. In that case, for example, the determination circuit 177 is unnecessary, and a division result of the divider circuit 176 is output as pixel data.

In addition, although the detection circuit 170 performs division using the divider circuit 176, it is not necessary to provide the divider circuit 176 at all times in order to perform photon counting, and thus the divider circuit 176 may not be provided.

[Example of Operation of Detection Circuit]

b of FIG. 4 is a diagram showing the example of the operation of the detection circuit 170 according to the first embodiment. The selected pixel circuit 140 outputs the reset signal to the vertical signal line 149 according to control of the row drive circuit 120 (Step S901).

In addition, two inputs to the comparator 174 are short-circuited due to the auto zero function of the comparator 174, the amount of the electric charge of the capacitors 172 and 173 is adjusted accordingly. Thus, the vertical signal line 149 and the reference signal line 169 are brought into a state of effective equilibrium (Step S902).

The reference voltage supply unit 160 supplies sweep signals for changing (reducing) the reference voltage $V_{ref}$ to the reference signal line 169 at a constant rate a plurality of times. The comparator 174 compares the voltage ($V_{ref}$) of the sweep signal and the reset level ($V_p$) of the reset signal. The timing control circuit 150 controls the counter 175 to initialize a count value. The counter 175 performs counting based on a reversal timing of the comparison result COMP. Accordingly, A/D conversion to convert the reset signal into the digital signal $D_{s1}$ is performed (Step S903).

Through the auto zero operation of Step S902, the voltage $V_p$ of the vertical signal line 149 and the voltage $V_{ref}$ of the reference signal line 169 are controlled to be a state of effective equilibrium. For this reason, the A/D converted voltage in Step S903 is practically an offset ($V_{ofs}$) generated inside the comparator 174. Such A/D conversion is performed a plurality of times, and in the A/D conversion, for example, count values are added through down-counting.

Then, the pixel circuit 140 outputs the exposure signal to the vertical signal line 149 according to control of the row drive circuit 120 (Step S904).

The reference voltage supply unit 160 supplies the sweep signal again a plurality of times, and the comparator 174 compares the voltage of the sweep signal ($V_{ref}$) and the signal level of the exposure signal ($V_p$). The timing control circuit 150 controls the counter 175 to switch down-counting to up-counting. The counter 175 performs counting based on a reversal timing of the comparison result COMP. Accordingly, A/D conversion is performed to convert the exposure signal to the digital signal $D_{s2}$ (Step S905).

Since the counter 175 switches down-counting to up-counting in Step S905, the difference between the count value of up-counting and the count value of down-counting is output in Step S905. An offset voltage of the comparator or kTC noise at the time of reset is removed by taking the difference between the digital signals $D_{s1}$ and $D_{s2}$.

The divider circuit 176 calculates the average value of the differences (CNT) as a net pixel signal, and the determination circuit 177 compares the average value and the threshold value to detect presence of incidence of photons (Step S906). After Step S906, the detection circuit 170 finishes the detection operation.

[Example of Operation of Image Sensor]

a of FIG. 5 is a timing chart showing an example of an operation of the image sensor 100 according to the first embodiment.

In Step T2, the row drive circuit 120 performs FD reset. At a timing T2' that is reached after a pulse period elapses from the timing T2, the pixel circuit 140 outputs a reset signal via the vertical signal line 149. In addition, the timing control circuit 150 supplies the initialization instruction signal RST to the counter 175 at the timing T2 to initialize a count value.

Here, due to the auto zero function of the comparator 174, voltages of the respective vertical signal line 149 and reference signal line 169 are in a state of substantially effective equilibrium at the timing T2'. The dot-and-dash line of a of the drawing indicates a relative variation of a voltage of the vertical signal line 149 in the state of equilibrium with respect to the reference signal line 169.

A constant offset voltage $V_{ofs}$ is generated in the reference signal line 169 at the timing T2. The reference voltage supply unit 160 supplies sweep signals through a given period from each of a plurality of sampling timings with respect to a reset signal. When sampling of the reset signal is performed 4 times, the supply of the sweep signals is started at each of sampling timings T31, T33, T35, and T37 of the reset signal. The interval of these sampling timings is $d_{s1}$. Then, the reference voltage supply unit 160 stops the supply of the sweep signals at timings T32, T34, T36, and T38 that are reached after a given period, which is shorter than the sampling interval, elapses from each of the sampling timings.

In addition, the timing control circuit 150 supplies a clock signal CLK to the counter 175 to cause it to count a count value through the period in which the sweep signals are supplied (from T31 to T32, etc.), and supply of the clock signal CLK is stopped in other periods.

The counter 175 performs down-counting through a period in which the reference voltage $V_{ref}$ is higher than the voltage of the vertical signal line 149 among the periods in which the sweep signals are supplied (from T31 to T32, etc.). This is executed by means of blocking supply of clocks to the counter caused by reversal of an output of the comparator, or the like. For example, when the reference voltage $V_{ref}$ is equal to or lower than the voltage of the vertical signal line 149 at a timing T31' between the timing T31 and T32, down-counting is performed from the timing T31 to T31'. Since the reference voltage $V_{ref}$ is equal to or lower than the voltage of the vertical signal line 149 from the timing T31' to T32, down-counting is not performed, and the count value is held. In addition, since the clock signal CLK is not supplied from the timing T32 to the next sampling timing T33, down-counting is not performed and the count value is held likewise.

Down-counting is performed likewise through periods in which the reference voltage $V_{ref}$ is higher than the voltage of the vertical signal line 149 from a timing T33 to T34, from a timing T35 to T36, and from a timing T37 to T38.

In addition, the pixel circuit 140 outputs an exposure signal at a timing T4 at which electric charge is transferred to the detection node 144. Furthermore, at this timing T4, the timing control circuit 150 causes the counting operation of the counter 175 to be switched from down-counting to up-counting using a switch instruction signal SW.

The reference voltage supply unit 160 supplies sweep signals through a given period from each of a plurality of sampling timings with respect to the exposure signal. When sampling of the exposure signal is performed 4 times, supply of the sweep signals is started at sampling timings T51, T53, T55, and T57 of the exposure signal. The interval of these sampling timings is $d_{s2}$. In addition, the reference voltage supply unit 160 stops the supply of the sweep signals at timings T52, T54, T56, and T58 that are reached after a given period has elapsed from these sampling timings.

Here, if an amount of change of the sweep signals is set to a sweep amount, the sweep amount at the time of sampling of the exposure signal is set to a value greater than that at the time of sampling of the reset signal.

The counter 175 performs up-counting through a period in which the reference voltage $V_{ref}$ is higher than the voltage of the vertical signal line 149 in the periods in which the sweep signals corresponding to the exposure signal are supplied (from T51 to T52, etc.).

The count value CNT is a summed value of all count values of the plurality of times of down-counting at a timing T38 at which the final sampling for the reset signal is finished. For example, the absolute values of the count values in the $1^{st}$, $2^{nd}$, $3^{rd}$ and $4^{th}$ times of sampling for the reset signal are set to $D_{s1-1}$, $D_{s1-2}$, $D_{s1-3}$, and $D_{s1-4}$, respectively. In this case, the count value CNT at the timing T38 is an initial value of $-D_{s1-1}-D_{s1-2}-D_{s1-3}-D_{s1-4}$. Note that $D_{s1-1}$, $D_{s1-2}$, $D_{s1-3}$, and $D_{s1-4}$ are examples of the first digital signal described in the claims.

In addition, since the operation is switched to up-counting from the timing T4, the count value CNT is the difference between the summed value of down-counting and the summed value of up-counting at the timing T58 at which the final sampling for the exposure signal is finished. For example, the absolute values of the $1^{st}$, $2^{nd}$, $3^{rd}$, and $4^{th}$ times of sampling for the exposure signal are set to $D_{s2-1}$, $D_{s2-2}$, $D_{s2-3}$, and $D_{s2-4}$, respectively. In this case, the count value CNT at the timing T58 is an initial value of $-D_{s1-1}-D_{s1-2}-D_{s1-3}-D_{s1-4}+D_{s2-1}+D_{s2-2}+D_{s2-3}+D_{s2-4}$. Note that $D_{s2-1}$, $D_{s2-2}$, $D_{s2-3}$, and $D_{s2-4}$ are examples of the second digital signal described in the claims.

As described above, the exposure sampling interval $d_{s2}$ is set to be no more than twice the reset sampling interval $d_{s1}$. Thus, it is possible to sufficiently reduce 1/f noise whose noise power increases as a frequency becomes lower.

On the other hand, in a general single slope (accumulation type) A/D converter, a sweep amount in A/D conversion of a signal level is far greater than that of a reset level, and accordingly the exposure sampling interval $d_{s2}$ is much greater than the reset sampling interval $d_{s1}$. For example, the exposure sampling interval $d_{s2}$ is set to about 10 times the reset sampling interval $d_{s1}$. In this manner, if sampling intervals are significantly different, it is not possible to sufficiently remove noise components of a low frequency.

b of FIG. 5 is a diagram obtained by enlarging a part 501 of the sweep signal of a of the same drawing. As shown in b of the drawing, the voltage of the sweep signals decreases at a constant rate through a given period of time (from T31 to T32, etc.) after the offset voltage $V_{ofs}$ is generated. The decreased amount in the given period corresponds to a sweep amount $\Delta V_{sweep1}$.

Figure 6:
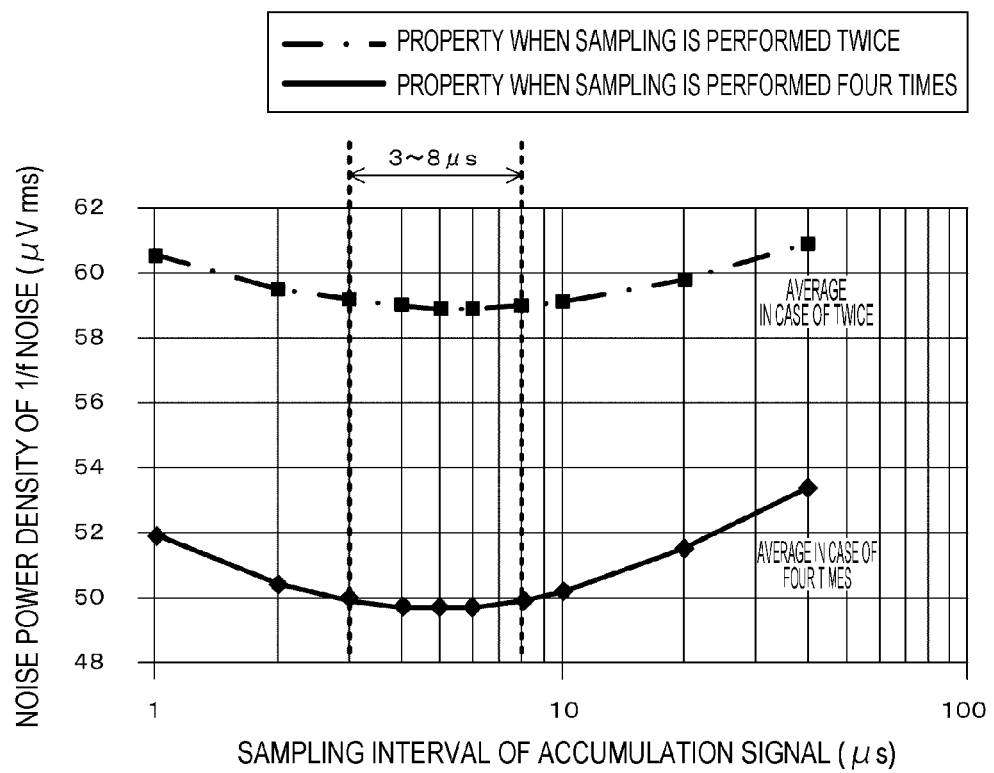
FIG. 6 is a graph showing an example of a relation between a sampling interval and noise power density according to the first embodiment.

FIG. 6 is a graph showing an example of a relation between a sampling interval and noise power density according to the first embodiment.

As described above, if the exposure sampling interval ds2 is set to be no more than twice the reset sampling interval ds1, 1/f noise is reduced. The method of eliciting this numerical range will be described. First, random noise is expressed using, for example, the following formula.

[Math. 1]

$$v^2 = \int_0^w p(f) * |H(f)|^2 * |s(\omega)|^2 df \qquad \text{Formula 1}$$

In Formula 1, p(f) is a noise density of 1/f noise of the pixel circuit 140, and the unit is, for example, $V^2/Hz$. This p(f) is expressed by, for example, the following formula.

$$p(f) = k/f \qquad \text{Formula 2}$$

k in the above formula is a noise coefficient of a transistor inside the pixel circuit 140, and for example, 5.6E–10($V^2$) is set. f is a frequency, and the unit is, for example, hertz (Hz).

In addition, in Formula 1, H(f) is a band limiting property of the comparator inside the detection circuit 170, and is expressed by the following formula.

$$H(f)^2 = 1/\{1+(f/f_c)^n\} \qquad \text{Formula 3}$$

In Formula 3, $f_c$ is a cutoff frequency, and the unit is, for example, hertz (Hz). n is a coefficient. When it is attempted to obtain a fitting cutoff frequency and n through a circuit simulation of the single slope (accumulation type) A/D converter, for example, 3.24 megahertz (MHz) is obtained as the cutoff frequency $f_c$, and 3.9 is obtained as n.

In addition, in Formula 1, s( ) indicates an amplitude of noise. Noise is assumed to be a sine wave to obtain this amplitude, and the number of times of sampling of respective reset signals and exposure signals is set to 2. Furthermore, the interval between the final sampling of the reset signal and the first sampling of the exposure signal is set to be the same as $d_{s1}$. In this case, if the phase of the first sampling timing of the reset signal is set to t, the phase of the second sampling timing of the reset signal is $t+d_{s1}$. In addition, the phase of the first sampling timing of the exposure signal is $t+2d_{s1}$, and the phase of the second sampling timing of the exposure signal is $t+2d_{s1}+d_{s2}$. Thus, displacement (t) of the noise is obtained through the following formula.

[Math. 2]

$$y(t) = [\cos(\omega t) + \cos\{\omega(t+d_{s1})\} - \cos\{\omega(t+2d_{s1})\} - \cos\{\omega(t+2d_{s1}+d_{s2})\}]/2 \qquad \text{Formula 4}$$

Here, an angular frequency is expressed by the following formula.

[Math. 3]

$$\omega = 2\pi \cdot f \qquad \text{Formula 5}$$

In addition, if Formula 4 is expressed in a complex notation in a polar form, the following formula is obtained.

[Math. 4]

$$y = (1 + e^{j\omega d_{s1}} - e^{j\omega 2d_{s1}} - e^{j\omega(2d_{s1}+d_{s2})})/2 \qquad \text{Formula 6}$$

If Formula 6 is converted from the polar form to a rectangular form, the following formula is obtained.

[Math. 5]

$$\begin{aligned} y &= [1 + \cos(\omega d_{s1}) + j \cdot \sin(\omega d_{s1}) - \cos(\omega 2 d_{s1}) - \\ &\quad j \cdot \sin(\omega 2 d_{s1}) - \cos\{\omega(2d_{s1}+d_{s2})\} - \\ &\quad j \cdot \sin\{\omega(2d_{s1}+d_{s2})\}]/2 \\ &= \{1 + \cos(\omega d_{s1}) - \cos(\omega 2 d_{s1}) - \\ &\quad \cos(\omega 2 d_{s1} + \omega d_{s2})\}/2 + \\ &\quad j \cdot \{\sin(\omega d_{s1}) - \sin(\omega 2 d_{s1}) - \\ &\quad \sin(\omega 2 d_{s1} + \omega d_{s2})\}/2 \end{aligned} \qquad \text{Formula 7}$$

The sum of squares of the real terms and imaginary terms of Formula 7 is the square of an amplitude. Thus, the amplitude is expressed by the following formula.

[Math. 6]

$$s(\omega)^2 = [1+\cos(\omega d_{s1}) - \cos(2\omega d_{s1}) - \cos\{\omega(2d_{s1}+d_{s2})\}]/4 + [(\sin(\omega d_{s1}) - \sin(2\omega d_{s1}) - \sin\{\omega(2d_{s1}+d_{s2})\}]^2/4 \qquad \text{Formula 8}$$

In addition, when the number of times of sampling of the reset signal and the exposure signal is 4, if the phase of the first sampling timing of the reset signal is set to t, the phase of the second sampling timing of the reset signal is $t+d_{s1}$. In addition, the phases of the $3^{rd}$ and $4^{th}$ sampling timings of the reset signal are $t+2d_{s1}$ and $t+3d_{s1}$. The phases of the $1^{st}$, $2^{nd}$, $3^{rd}$ and $4^{th}$ sampling timings of the exposure signal are $t+4d_{s1}$, $t+4d_{s1}+d_{s2}$, $t+4d_{s1}+2d_{s2}$, and $t+4d_{s1}+3d_{s2}$. Thus, displacement y(t) of the noise at this time is obtained through the following formula.

[Math. 7]

$$\begin{aligned} y(t) = \{&\cos(\omega t) + \cos\{\omega(t+d_{s1})\} + \\ &\cos\{\omega(t+2d_{s1})\} + \cos\{\omega(t+3d_{s1})\} - \\ &\cos\{\omega(t+4d_{s1})\} - \cos\{\omega(t+4d_{s1}+d_{s1})\} - \\ &\cos\{\omega(t+4d_{s1}+2d_{s1})\} - \cos\{\omega(t+4d_{s1}+4d_{s2})\}\}/4 \end{aligned} \qquad \text{Formula 9}$$

If Formula 9 is expressed in a complex notation in a polar form, the following formula is obtained.

[Math. 8]

$$y = (1 + e^{j\omega d_{s1}} + e^{j\omega 2 d_{s1}} + e^{j\omega 3 d_{s2}} - e^{j\omega 4 d_{s2}} - e^{j\omega(4d_{s1}+d_{s2})} - e^{j\omega(4d_{s1}+2d_{s2})} - e^{j\omega(4d_{s1}+3d_{s2})})/4 \qquad \text{Formula 10}$$

If Formula 10 is converted from the polar form to a rectangular form, the following formula is obtained.

[Math. 9]

$$y = \{1 + \cos(\omega d_{s1}) + \cos(\omega 2 d_{s1}) + \\
\cos(\omega 3 d_{s1}) - \cos(\omega 4 d_{s1}) - \cos(\omega 4 d_{s1} + \omega d_{s2}) - \\
\cos(\omega 4 d_{s1} + \omega 2 d_{s2}) - \cos(\omega 4 d_{s1} + \omega 3 d_{s2})\}/2 + \\
j \cdot \{(\sin(\omega d_{s1}) + \sin(\omega 2 d_{s1}) + \sin(\omega 3 d_{s1}) - \\
\sin(\omega 4 d_{s1}) - \sin(\omega 4 d_{s1} + \omega d_{s2}) - \\
\sin(\omega 4 d_{s1} + \omega 2 d_{s2}) - \sin(\omega 4 d_{s1} + \omega 3 d_{s2})\}/2$$

Formula 11

The sum of squares of the real terms and imaginary terms of Formula 11 is the square of an amplitude. Thus, the amplitude is expressed by the following formula.

[Math. 10]

$$s(\omega)^2 = [1 + \cos(\omega d_{s1}) + \cos(\omega 2 d_{s1}) + \\
\cos(\omega 3 d_{s1}) - \cos(\omega 4 d_{s1}) - \cos\{\omega(4 d_{s1} + d_{s2})\} - \\
\cos\{\omega(4 d_{s1} + 2 d_{s2})\} - \cos\{\omega(4 d_{s1} + 3 d_{s2})\}]/4 + \\
[\sin(\omega d_{s3}) + \sin(\omega 2 d_{s3}) + \sin(\omega 3 d_{s3}) - \\
\sin(\omega 4 d_{s1}) - \sin\{\omega(4 d_{s1} + d_{s2})\} - \\
\sin\{\omega(4 d_{s1} + 2 d_{s2})\} - \sin\{\omega(4 d_{s1} + 3 d_{s2})\}]^2/4$$

Formula 12

If specific numerical values are set for the sampling intervals $d_{s1}$ and $d_{s2}$ and the right side of Formula 8 or Formula 12 is substituted into Formula 1, noise power density when the number of times of sampling is 2 or 4 is calculated. A graph in which noise power density calculated by fixing the reset sampling interval $d_{s1}$ to 4 microseconds (μs) and changing the exposure sampling interval $d_{s2}$ to 1 to 40 microseconds (μs) is shown in FIG. 6. In the drawing, the vertical axis represents noise power density of 1/f noise, and the horizontal axis represents exposure sampling intervals. The dot-and-dash line indicates a property when the number of times of sampling of the respective reset signal and exposure signal is 2, and the solid line indicates a property when the number of times of sampling is 4.

As exemplified in FIG. 6, as the exposure sampling interval $d_{s2}$ becomes longer, the noise power density increases. In order to set the noise power density to a tolerance value or lower, it is necessary to set the exposure sampling interval $d_{s2}$ to 8 microseconds (i.e., twice $d_{s1}$) or shorter. In particular, it is desirable to set the exposure sampling interval $d_{s2}$ to 3 to 8 microseconds (i.e., 0.7 to 2.0 times $d_{s1}$). If $d_{s2}$ is set to 0.7 to 2.0 times $d_{s1}$, for example, an effect of noise reduction of 5% or more is obtained when sampling is performed 4 or more times. In addition, it is more desirable to set $d_{s2}$ to be 0.7 to 1.5 times $d_{s1}$. Furthermore, it is most desirable to set $d_{s2}$ to be the same as $d_{s1}$.

In addition, as the number of times of sampling increases, the noise power density becomes lower. The number of times of sampling of the respective reset signal and exposure signal is desirably 4 times or more.

Furthermore, although the number of times of sampling of the reset signal is set to be the same as the number of times of sampling of the exposure signal, the number may be different.

Figure 7:
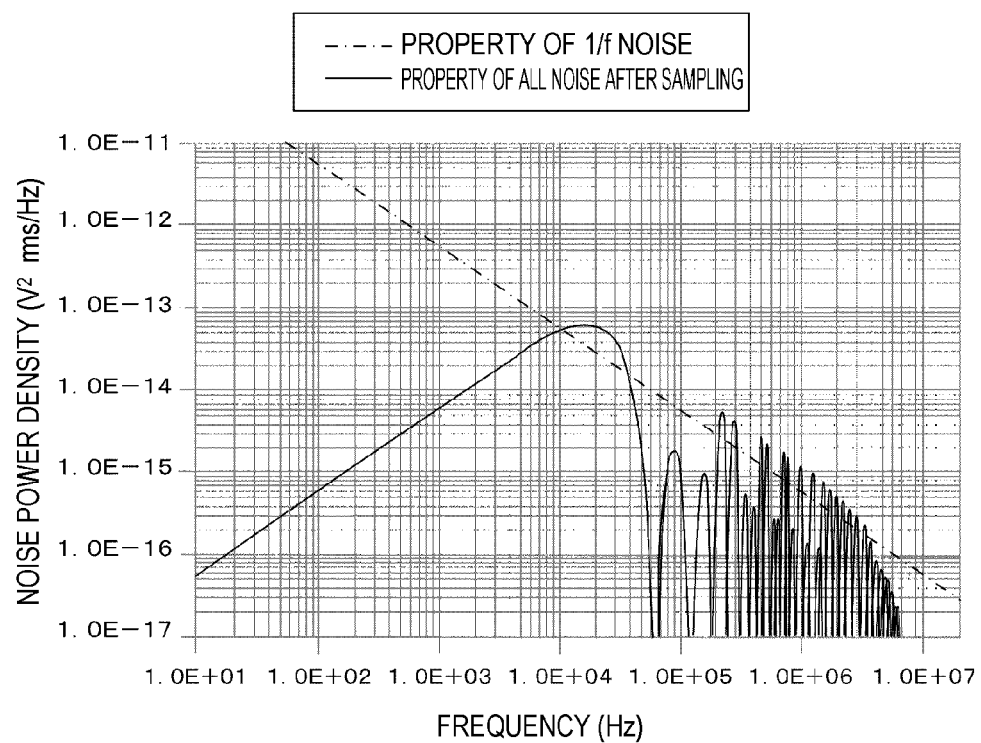
FIG. 7 is a graph showing an example of a relation between a frequency and noise power density according to the first embodiment.

FIG. 7 is a graph showing an example of a relation between frequencies and noise power density according to the first embodiment. The vertical axis of the drawing represents noise power density, and the horizontal axis represents frequency. In addition, the solid line indicates a property of all noise after sampling, and the dot-and-dash line indicates a property of 1/f noise included in the noise. As shown in the drawing, as the frequency becomes lower, the noise power density of 1/f noise increases. Noise other than the 1/f noise is effectively removed through correlated double sampling in which the exposure sampling interval $d_{s2}$ is set to be no more than twice the reset sampling interval $d_{s1}$ as described above.

According to the first embodiment of the present technology, the reset signal is sampled at the interval $d_{s1}$, and the exposure signal is sampled at the interval $d_{s2}$ that is no more than twice the interval $d_{s1}$ as described above, and thus noise of low frequencies can be effectively removed.

[First Modified Example]

In the first embodiment, a sweep amount corresponding to an exposure signal is set to be greater than a sweep amount corresponding to a reset signal. However, in applications of radiation counting or fluorescence detection using scintillation, illuminance of scintillation light is very low in most cases. In addition, there are cases in applications of digital still cameras and surveillance cameras in which illuminance of natural light is very low as well, such as at night. When illuminance is very low as described, there are cases in which a level of an exposure signal is equal to or lower than a level of offset noise generated in the comparator 174. In such a case, it is desirable to set a sweep amount corresponding to an exposure signal to the same value as a sweep amount corresponding to a reset signal. Accordingly, accuracy in photodetection can be raised. An image sensor 100 according to a first modified example is different from that of the first embodiment in that a sweep amount corresponding to an exposure signal is set to the same value as a sweep amount corresponding to a reset signal.

Figure 8:
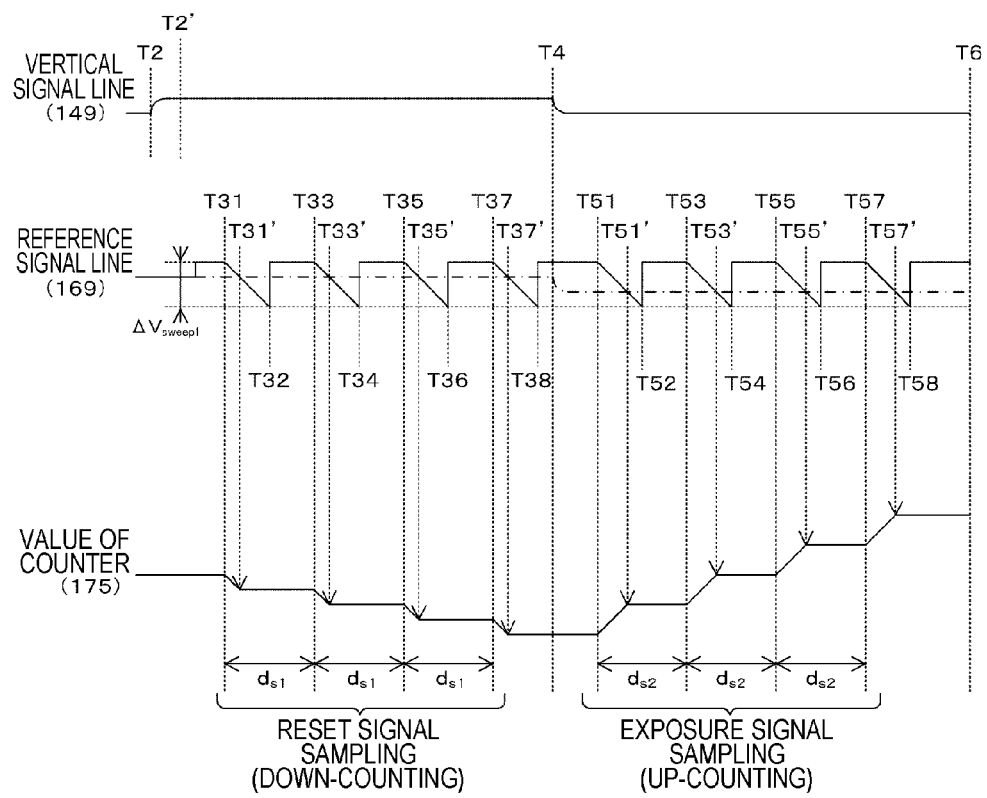
FIG. 8 is a timing chart showing an example of an operation of an image sensor according to a first modified example of the first embodiment.

FIG. 8 is a timing chart showing an example of an operation of the image sensor according to the first modified example of the first embodiment. As exemplified in the drawing, a sweep amount corresponding to an exposure signal is set to be the same value as a sweep amount $\Delta V_{sweep1}$ corresponding to a reset signal. Only zero to a few photons are incident on each pixel circuit 140 in an environment with ultra-low illuminance, and it is desirable in such an environment to actively use the sequence of the drawing.

Since the sweep amount of a sweep signal corresponding to the reset signal is set to be substantially the same as the sweep amount of a sweep signal corresponding to the exposure signal according to the first modified example as described above, even when the level of the exposure signal is very low, light can be detected with high accuracy.

[Second Modified Example]

Although the counter 175 switches its operation from down-counting to up-counting when exposure is finished in the first embodiment, only one of up-counting and down-counting may be performed without switching. An image sensor 100 of a second modified example is different from that of the first embodiment in that a counter performs only one of up-counting and down-counting.

Figure 9:
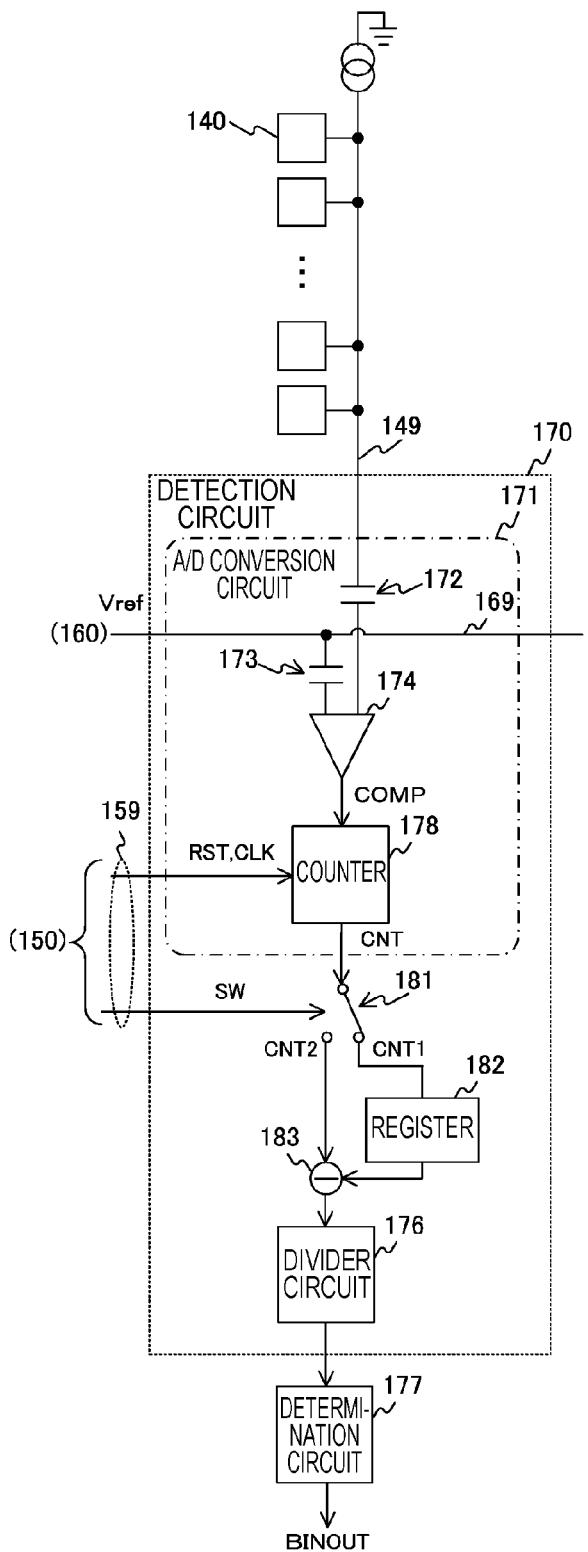
FIG. 9 is a diagram showing an example of a configuration of a detection circuit according to a second modified example of the first embodiment.

FIG. 9 is a diagram showing an example of a configuration of a detection circuit 170 according to the second modified example of the first embodiment. The detection circuit 170 of the second modified example is different from that of the first embodiment in that the circuit includes a counter 178 in place of the counter 175, and a switch 181, a register 182, and a subtracter 183.

The counter 178 has a configuration similar to the counter 175 of the first embodiment except that only one of up-counting and down-counting is performed. The counter 178 supplies a count value CNT to the switch 181.

The switch 181 switches an output destination of a count value CNT according to a switch instruction signal SW. This switch 181 supplies a count value CNT1 to the register 182 before a timing T4 at which an exposure period ends, and supplies a count value CNT2 to the subtracter 183 from the timing T4. The register 182 holds the count value CNT1. This count value CNT1 is an integrated value of digital signals converted from reset values (initial value of $+D_{s1-1}+D_{s1-2}+D_{s1-3}+D_{s1-4}$, etc.).

The subtracter 183 subtracts one of the count value CNT2 from the switch 181 and the count value CNT1 held in the register 182 from the other. The subtracter 183 supplies the subtraction result to the divider circuit 176.

Note that, although the counter 178 integrates count values of a plurality of times of sampling, the counter may not perform such integration. In that case, an integrator circuit may be further provided in the detection circuit 170. The counter 178 counts count values from the initial value at each sampling timing such as a timing T31 and supplies the values to the integration circuit, and the integration circuit integrates the count values and supplies the result to the switch 181.

Since the counter performs only one of up-counting and down-counting according to the second modified example as described above, a counter with a simpler circuit configuration than a counter that switches to both modes can be used.

<1. Second Embodiment>

Although the image sensor 100 is used for photon detection in the first embodiment, the image sensor 100 can also be used for radiation counting. The second embodiment is different from the first embodiment in that the image sensor 100 is used for radiation counting.

Figure 10:
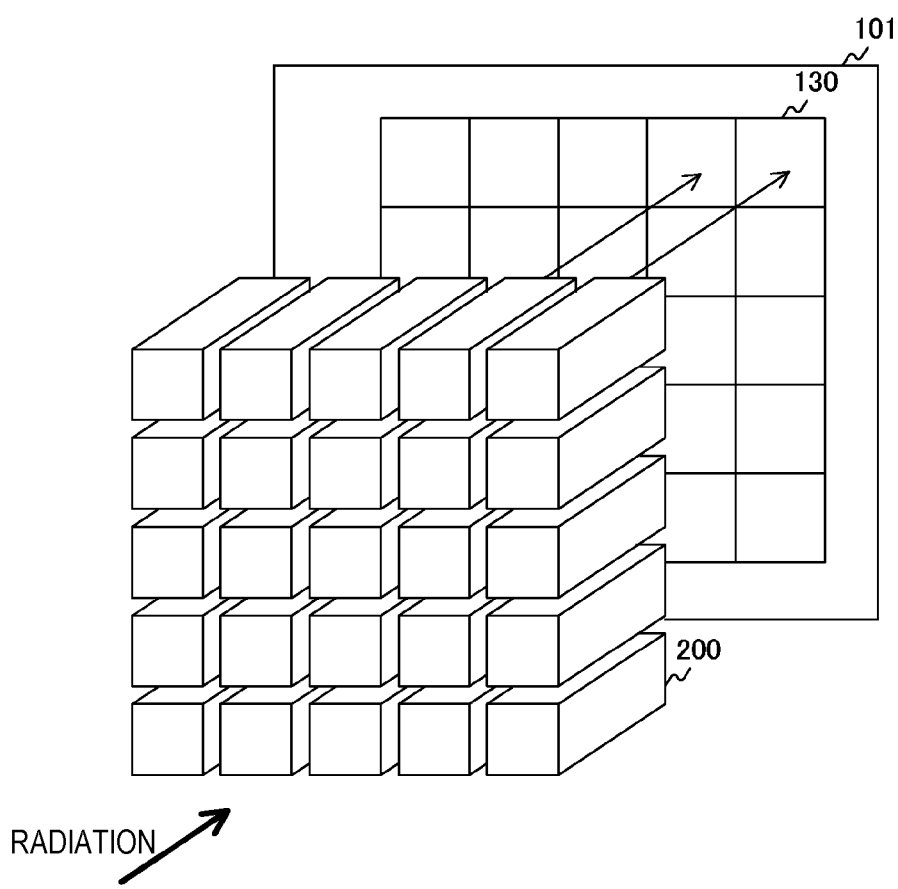
FIG. 10 is a diagram showing an example of a configuration of a radiation counting device according to a second embodiment.

FIG. 10 is a whole diagram showing an example of a configuration of a radiation counting device according to the second embodiment. The radiation counting device has a plurality of scintillators 200 and a semiconductor device 101. The semiconductor device 101 is provided with the image sensor 100 of the first embodiment and a digital processing unit (not illustrated).

The scintillators 200 are scintillators processed in pillar shapes or fiber shapes, and is disposed at a pitch of 1 millimeter (mm), for example. Each of the scintillator 200 is isolated by a partition which reflects light so that scintillation light is confined therein.

In the semiconductor device 101, a pixel array unit 130 is logically divided into 1-square-millimeter (mm$^2$) regions corresponding to the scintillators 200. By connecting the scintillator 200 and the image sensor 100, the scintillation light generated in the scintillators 200 is selectively radiated to the corresponding compartments in the pixel array unit 130, and then the light amount is measured.

The digital processing unit in the semiconductor device 101 classifies energy of incident radiation based on the light emission amount of the scintillators 200 and measures the incident frequency based on the number of times of the light emission.

For example, when it is assumed that the size of each pixel of the semiconductor device 101 is about 4×4 square micrometers (μm$^2$), 250×250 (=62,500) pixel circuits 140 are included in the compartments of the pixel array unit 130. Determination of a light amount is elicited by totalizing pixel outputs of the compartments. Each pixel output may be a grayscale-determined value such as one with 10 bits, and when random noise is suppressed to be sufficiently smaller than one photon signal, it may be a binary determination value threshold-determined based on presence of incidence of photons.

For each scintillator 200, for example, a cerium doped lutetium yttrium orthosilicate (LYSO:Ce) is used. In this case, the light emission amount when gamma rays of 662 keV enter is about 10,000 photons, and therefore the light receiving amount of each pixel is 0 photon or 1 photon in many cases. Random noise of each pixel is added thereto.

In the gradation determination, it is desirable for the minimum resolution (least significant bit value or LSB) to be sufficiently smaller than 1 photon, and thus the total noise amount is maintained in a stable range. For example, when random noise of each pixel is about one electron signal (rms), the total of the pixel noise of the compartments is about 250 electron signals (rms).

Such a radiation counting device can be used alone for detection of radioactive contamination or cosmic rays as a dosimeter. Furthermore, if a blank portion of the semiconductor device 101 is minimized by utilizing a stacked structure and detectors can be laid in an array shape, the radiation counting device can be used for two-dimensional imaging of radiations, like a gamma camera.

Note that the digital processing unit may change a sweep amount of sampling of an exposure signal according to a radiation incidence frequency. For example, when a radiation incidence frequency is higher than a give value, the digital processing unit may set to the sweep amount exemplified in FIG. 5, and when it is not, the unit may switch to a sweep amount for low illuminance exemplified in FIG. 8.

As described above, according to the second embodiment, the radiation counting device samples reset signals at the interval $d_{s1}$ and samples exposure signal of weak light at the interval $d_{s2}$ that is no more than twice the interval $d_{s1}$, and thus noise of low frequencies can be removed and thereby weak light can be detected. Accordingly, the radiation counting device can count radiations from the detection result.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

The processing sequences that are described in the embodiments described above may be handled as a method having a series of sequences or may be handled as a program for causing a computer to execute the series of sequences and as a recording medium storing the program. As the recording medium, a compact disc (CD), a MiniDisc (MD), and a digital versatile disc (DVD), a memory card, and a Blu-ray disc (a registered trademark) can be used.

In addition, the effects described in the present specification are not limiting but are merely examples, and there may be additional effects.

Additionally, the present technology may also be configured as below.

(1)

A semiconductor photodetection device including:

a pixel circuit configured to generate a reset signal of a predetermined initial voltage and an exposure signal of a signal voltage according to an exposure amount of light in order;

an analog-digital conversion unit configured to perform a reset sampling process of converting the reset signal into a first digital signal at a predetermined reset sampling interval and an exposure sampling process of converting the exposure signal into a second digital signal at an exposure sampling interval that does not exceed twice the predetermined reset sampling interval in order; and a detection unit configured to detect the light based on the first digital signal and a second digital signal.

(2)
The semiconductor photodetection device according to (1), wherein the exposure sampling interval is a value that is 0.7 to 2.0 times the reset sampling interval.

(3)
The semiconductor photodetection device according to (2), wherein the exposure sampling interval is a value that is 0.7 to 1.5 times the reset sampling interval.

(4)
The semiconductor photodetection device according to (3), wherein the exposure sampling interval is a substantially identical value as the reset sampling interval.

(5)
The semiconductor photodetection device according to any one of (1) to (4), wherein
the analog-digital conversion unit includes:
a comparison unit configured to perform a process of comparing a voltage of a first sweep signal whose voltage changes at a constant rate after a timing of sampling of the reset signal elapses and a voltage of the reset signal, and a process of comparing a voltage of a second sweep signal whose voltage changes at a constant rate after a timing of sampling of the exposure signal elapses and a voltage of the reset signal in order; and
a counter configured to count a count value according to a result obtained by the comparison performed by the comparison unit and supply a signal of the count value as the digital signal, and
amounts of change of the respective first sweep signal and second sweep signal are identical.

(6)
The semiconductor photodetection device according to any one of (1) to (5), wherein the analog-digital conversion unit converts the reset signal into the first digital signal a number of times more than three times, and converts the exposure signal into the second digital signal a number of times more than three times.

(7)
The semiconductor photodetection device according to any one of (1) to (6), wherein the detection unit detects the light based on the difference between the first digital signal and the second digital signal.

(8)
The semiconductor photodetection device according to (7), wherein the detection unit detects the light based on whether a value according to the difference exceeds a predetermined threshold value.

(9)
The semiconductor photodetection device according to (7), wherein the detection unit calculates a statistic of the difference as a detection result of the light.

(10)
A radiation counting device including:
a scintillator configured to emit scintillation light when a radiation enters;

a pixel circuit configured to generate a reset signal of a predetermined initial voltage and an exposure signal of a signal voltage according to an exposure amount of the scintillation light;

an analog-digital conversion unit (171) configured to perform a reset sampling process of converting the reset signal into a first digital signal at a predetermined reset sampling interval and an exposure sampling process of converting the exposure signal into a second digital signal at an exposure sampling interval that does not exceed twice the predetermined reset sampling interval in order; and a detection unit (177) configured to detect the light based on the first digital signal and the second digital signal.

(11)
A method of controlling a semiconductor photodetection device, the method including:
a signal generation step of a pixel circuit generating a reset signal of a predetermined initial voltage and an exposure signal of a signal voltage according to an exposure amount of light;

an analog-digital conversion step of an analog-digital conversion unit performing a reset sampling process of converting the reset signal into a first digital signal at a predetermined reset sampling interval and an exposure sampling process of converting the exposure signal into a second digital signal at an exposure sampling interval that does not exceed twice the predetermined reset sampling interval in order; and a detection step of a detection unit detecting the light based on the first digital signal and the second digital signal.

REFERENCE SIGNS LIST 100 image sensor
101 semiconductor device
110 constant current circuit
111 MOS transistor
120 row drive circuit
130 pixel array unit
140 pixel circuit
141 photodiode
142 accumulation node
143 transfer transistor
144 detection node
145 reset transistor
146 amplifier transistor
147 selection transistor
150 timing control circuit
160 reference voltage supply unit
170 detection circuit
171 A/D conversion circuit
172, 173 capacitor
174 comparator
175, 178 counter
176 divider circuit
177 determination circuit
181, 185 switch
182 register
183 subtracter
190 output circuit
200 scintillator

What is claimed is:
1. A semiconductor photodetection device comprising:
a pixel circuit configured to generate a reset signal of a predetermined initial voltage and an exposure signal of a signal voltage according to an exposure amount of light in order;

an analog-digital conversion unit configured to perform a reset sampling process of converting the reset signal into a first digital signal at a predetermined reset sampling interval and an exposure sampling process of converting the exposure signal into a second digital signal at an exposure sampling interval that does not exceed twice the predetermined reset sampling interval in order, wherein the analog-digital conversion unit comprises:
- a comparison unit configured to compare a voltage of a first sweep signal whose voltage changes at a first constant rate after a first pulse period elapses with a voltage of the reset signal, and compare a voltage of a second sweep signal whose voltage changes at a second constant rate after a second pulse period elapses with a voltage of the exposure signal in order; and
- a counter configured to count a count value according to a result obtained by the comparisons performed by the comparison unit and to supply a signal of the count value; and
a detection unit configured to detect the light based on the signal of the count value.

2. The semiconductor photodetection device according to claim 1, wherein the exposure sampling interval is a value that is 0.7 to 2.0 times the reset sampling interval.

3. The semiconductor photodetection device according to claim 1, wherein the exposure sampling interval is a value that is 0.7 to 1.5 times the reset sampling interval.

4. The semiconductor photodetection device according to claim 1, wherein the exposure sampling interval is a substantially identical value as the reset sampling interval.

5. The semiconductor photodetection device according to claim 1, wherein
amounts of change of the first sweep signal and second sweep signal are identical.

6. The semiconductor photodetection device according to claim 1, wherein the analog-digital conversion unit converts the reset signal into the first digital signal a number of times more than three times, and converts the exposure signal into the second digital signal a number of times more than three times.

7. The semiconductor photodetection device according to claim 1, wherein the detection unit detects the light based on a difference between the first digital signal and the second digital signal.

8. The semiconductor photodetection device according to claim 7, wherein the detection unit detects the light based on whether a value according to the difference exceeds a predetermined threshold value.

9. The semiconductor photodetection device according to claim 7, wherein the detection unit calculates a statistic of the difference as a detection result of the light.

10. The semiconductor photodetection device according to claim 1, wherein the counter decreases the count value based on the comparison of the voltage of the first sweep signal with the voltage of the reset signal, and wherein the counter increases the count value based on the comparison of the voltage of the second sweep signal with the voltage of the exposure signal.

11. A radiation counting device comprising:
- a scintillator configured to emit scintillation light when a radiation enters;
- a pixel circuit configured to generate a reset signal of a predetermined initial voltage and an exposure signal of a signal voltage according to an exposure amount of the scintillation light;
- an analog-digital conversion unit configured to perform a reset sampling process of converting the reset signal into a first digital signal at a predetermined reset sampling interval and an exposure sampling process of converting the exposure signal into a second digital signal at an exposure sampling interval that does not exceed twice the predetermined reset sampling interval in order, wherein the analog-digital conversion unit comprises:
  - a comparison unit configured to compare a voltage of a first sweep signal whose voltage changes at a first constant rate after a timing of sampling of the reset signal elapses with a voltage of the reset signal, and compare a voltage of a second sweep signal whose voltage changes at a second constant rate after a timing of sampling of the exposure signal elapses with a voltage of the reset signal in order; and
  - a counter configured to count a count value according to a result obtained by the comparisons performed by the comparison unit and to supply a signal of the count value; and
- a detection unit configured to detect the light based on the signal of the count value.

12. The radiation counting device according to claim 11, wherein the counter decreases the count value based on the comparison of the voltage of the first sweep signal with the voltage of the reset signal, and wherein the counter increases the count value based on the comparison of the voltage of the second sweep signal with the voltage of the exposure signal.

13. A method of controlling a semiconductor photodetection device, the method comprising:
- a signal generation step of a pixel circuit generating a reset signal of a predetermined initial voltage and an exposure signal of a signal voltage according to an exposure amount of light;
- an analog-digital conversion step of an analog-digital conversion unit performing a reset sampling process of converting the reset signal into a first digital signal at a predetermined reset sampling interval and an exposure sampling process of converting the exposure signal into a second digital signal at an exposure sampling interval that does not exceed twice the predetermined reset sampling interval in order, wherein the analog-digital conversion unit comprises:
  - a comparison unit configured to compare a voltage of a first sweep signal whose voltage changes at a first constant rate after a timing of sampling of the reset signal elapses with a voltage of the reset signal, and compare a voltage of a second sweep signal whose voltage changes at a second constant rate after a timing of sampling of the exposure signal elapses with a voltage of the reset signal in order; and
  - a counter configured to count a count value according to a result obtained by the comparisons performed by the comparison unit and to supply a signal of the count value; and
- a detection step of a detection unit detecting the light based on the signal of the count value.

14. The method according to claim 13, wherein the counter decreases the count value based on the comparison of the voltage of the first sweep signal with the voltage of the reset signal, and wherein the counter increases the count value based on the comparison of the voltage of the second sweep signal with the voltage of the exposure signal.

* * * * *